United States Patent [19]

Tickle et al.

[11] 4,398,338

[45] Aug. 16, 1983

[54] FABRICATION OF HIGH SPEED, NONVOLATILE, ELECTRICALLY ERASABLE MEMORY CELL AND SYSTEM UTILIZING SELECTIVE MASKING, DEPOSITION AND ETCHING TECHNIQUES

[75] Inventors: Andrew C. Tickle, Los Altos; Madhukar B. Vora, Los Gatos, both of Calif.

[73] Assignee: Fairchild Camera & Instrument Corp., Mountain View, Calif.

[21] Appl. No.: 219,784

[22] Filed: Dec. 24, 1980

[51] Int. Cl.³ .................... H01L 21/20; H01L 21/225
[52] U.S. Cl. ................................. 29/571; 29/577 C; 29/578; 29/591; 148/1.5; 148/174; 148/175; 156/643; 357/23; 357/59; 357/92
[58] Field of Search ..................... 29/571, 578, 577 C, 29/591; 148/174, 175, 1.5, 187, 188; 156/643; 357/23 VT, 92, 59

[56] References Cited

U.S. PATENT DOCUMENTS

| | | | |
|---|---|---|---|
| 3,609,479 | 9/1971 | Lin et al. | 357/43 |
| 3,648,125 | 3/1972 | Peltzer | 148/175 X |
| 3,893,085 | 7/1975 | Hansen | 357/23 VT X |
| 3,996,657 | 12/1976 | Simko et al. | 29/571 |
| 4,168,999 | 9/1979 | Vora et al. | 148/175 |
| 4,234,362 | 11/1980 | Riseman | 357/59 X |
| 4,237,472 | 12/1980 | Hollingsworth | 357/23 VT X |
| 4,247,861 | 1/1981 | Hsu et al. | 357/23 VT X |
| 4,258,378 | 3/1981 | Wall | 357/23 VT X |
| 4,322,883 | 4/1982 | Abbas et al. | 148/188 X |

OTHER PUBLICATIONS

Gaensslen et al., "Hybrid IGFET-Bipolar Transistor" IBM Tech. Discl. Bull. vol. 12, No 12, May 1970, pp. 2327-2328.

Carballo et al., "Self-Contained Bipolar-FET Device" Ibid, vol. 19, No. 11, Apr. 1977, pp. 4191-4192.

Primary Examiner—W. G. Saba
Attorney, Agent, or Firm—Kenneth Olsen; Michael J. Pollock; Theodore Scott Park

[57] ABSTRACT

A process for fabricating an electrically erasable nonvolatile memory cell comprises forming a first region of insulating material which is less than about 200 Angstroms thick on a selected surface portion of an electrically-isolated relatively lightly doped pocket of epitaxial silicon of a first conductivity type such that first and second surface areas of the epitaxial pocket are exposed. Regions of the epitaxial pocket underlying the first and second exposed surface areas are doped such that first and second relatively lightly doped regions of a second conductivity type are formed in the epitaxial pocket. Relatively heavily doped polysilicon regions of the first conductivity type are formed on the first insulating region and on the second relatively lightly doped epitaxial region. Insulating material is formed over exposed surfaces of the first polysilicon region and the second polysilicon region such that first and second surface portions of the second relatively lightly doped epitaxial region are exposed. The regions of the epitaxial pocket underlying the surface of the first relatively lightly doped epitaxial region and the first and second surface portions of the second relatively lightly doped epitaxial region are doped such that first, second and third relatively heavily doped epitaxial regions of the second conductivity type are formed in the epitaxial pocket. Relatively heavily doped polysilicon of the second conductivity type is formed on the insulating regions covering said first conductivity type polycrystalline regions.

6 Claims, 18 Drawing Figures

FABRICATION OF HIGH SPEED, NONVOLATILE, ELECTRICALLY ERASABLE MEMORY CELL AND SYSTEM UTILIZING SELECTIVE MASKING, DEPOSITION AND ETCHING TECHNIQUES

BACKGROUND OF THE INVENTION

The present invention relates to electrically erasable memory systems and in particular to a high speed, nonvolatile, electrically erasable memory cell and system.

Piror art nonvolatile memory systems have been restricted to field effect transistor, typically MOS, technology with a resultant limitation in operating speed. While it is well known that higher operating speeds are provided by bipolar technology, prior bipolar art has lacked a nonvolatile storage mechanism.

The present invention provides a process wherein a series of steps utilizable for fabricating complete bipolar circuit elements is supplemented by steps which result in a nonvolatile memory cell. Thus, according to the present invention, an electrically erasable nonvolatile memory array is provided which may be readily fabricated on the same chip with high speed bipolar driving, decoding and sensing circuits utilizing a minimum number of process steps.

SUMMARY OF THE INVENTION

According to a preferred embodiment of the present invention, an N+ buried layer region is formed in the upper surface of a substrate of P-type semiconductor material. An N− epitaxial layer is then formed on the surface of the substrate and the buried layer. Next, a closed loop of isolation oxide is formed such that the oxide extends through the epitaxial layer to the lateral junction between the buried layer and the substrate to form an electrically isolated pocket of N− epitaxial silicon. A thin region of silicon dioxide which is less than about 200 Angstroms thick is then formed over a selected portion of the surface of the epitaxial pocket such that first and second areas of the surface are defined. The defined first and second surface areas of the epitaxial pocket are then subjected to ion implantation such that first and second P− epitaxial regions are formed in the epitaxial pocket. Next, a first region of N+ polysilicon is formed on the thin oxide region and a second N+ polysilicon region is formed on the second P− epitaxial region. A second region of silicon dioxide is then formed on exposed surfaces of the first N+ polysilicon region and a third region of silicon dioxide is formed on exposed surfaces of the second N+ polysilicon region. Formation of the third silicon dioxide region results in the definition of first and second selected surface portions of the second P− epitaxial region. The surface of the first P− epitaxial region and the first and second selected surface portions of the second P− epitaxial region are then subjected to ion implantation such that first, second and third P+ epitaxial regions are formed in the epitaxial pocket. A first region of P+ polysilicon is then formed on the second silicon dioxide region and a second region of P+ polysilicon is formed on the third silicon dioxide region. Finally, a layer of silicon dioxide is formed over the entire exposed upper surface of the structure.

The process of the present invention results in a high speed, nonvolatile memory cell which comprises a pMOS floating gate transistor for data storage and a merged npn bipolar transistor for selective access to stored data. The first region of N+ polysilicon forms the floating gate and the first region of P+ polysilicon forms the control gate of the pMOS floating gate storage transistor. The second region of N+ polysilicon forms the emitter of the npn bipolar transistor. The second region of P+ polysilicon forms the contact to the second and third P+ epitaxial regions which form part of the base of the npn bipolar transistor. The N+ buried layer serves as the collector of the npn bipolar transistor.

The pMOS floating gate transistor acts similarly to a current source, injecting (depending on its threshold) either finite or zero base current into the npn bipolar transistor, causing the bipolar transistor to exhibit either high or low impedance.

The above-described memory cell may be utilized in a novel electrically erasable nonvolatile memory array. The memory array comprises a matrix of such memory cells formed as a plurality of rows and a plurality of columns. A plurality of X write lines are provided, the control gate of each pMOS storage transistor in a row of memory cells being connected to an X write line corresponding to that row. A plurality of X sense lines are also provided, the emitter of each bipolar transistor in a row of cells being connected to an X sense line corresponding to that row. A plurality of source lines are also provided, the source of each pMOS storage transistor in row of cells being connected to a source line corresponding to that row. A plurality of Y sense lines are also provided, the collector of each bipolar transistor in a column of cells being connected to a Y sense line corresponding to that column. In a preferred embodiment, continuous strips of N+ buried layer form the Y sense lines and are OR-tied to the collectors of the bipolar transistors in the corresponding column.

Binary data is encoded into the memory array by applying an erase voltage to each of the Y sense lines in the array, and, simultaneously, maintaining each of the X sense lines at the erase voltage. At the same time, each of the X write lines is maintained at ground and the erase voltage is applied to each of the source lines. This condition causes each of the storage transistors to assume a relatively negative threshold state. Next, a write voltage is applied to selected X write lines while unselected X write lines are maintained at ground. Simultaneously, selected Y sense lines are maintained at ground and an inhibit voltage which is less than the write voltage is applied to unselected Y sense lines. At the same time, each of the X sense lines in the array is maintained at an intermediate voltage which is less than or equal to the base/emitter breakdown voltage of the bipolar transistors. These conditions cause the pMOS storage transistors of the memory cells located at the intersections of the selected X write lines and the selected Y sense lines to assume a relatively positive threshold state.

To read binary data from the array, a selected X sense line is maintained at ground while unselected X sense lines and each Y sense line are maintained at about +3 volts. At these conditions, memory cells connected to the selected X sense lines and having pMOS storage transistors in the relatively negative threshold state are less conducting than memory cells connected to the selected X sense line and having storage transistors in the relatively high threshold state. The memory cells connected to the selected X sense line are then monitored to determine their relative conductance.

DETAILED DESCRIPTION OF A PREFERRED EMBODIMENT

Each step in the process of the present invention may be accomplished using known semiconductor technology. A preferred embodiment of the process is described in conjunction with FIGS. 1-14.

Figure 1:
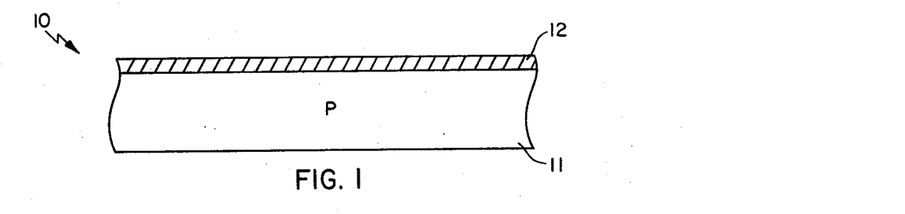
FIG. 1 is a cross-sectional view of a semiconductor substrate having a silicon dioxide layer formed on its upper surface.

As shown in FIG. 1, a wafer 10 comprising a substrate 11 of P-type semiconductor material, with resistivity between 1.5 and 3.0 ohm centimeters and crystalline orientation 111 is thermally oxidized to create an overlying silicon dioxide layer 12. The substrate 11 is oxidized by being subjected to 120 minutes of steam oxidation at 1000° C. These conditions produce a silicon dioxide layer 12 which is approximately 6000-7000 Angstroms thick.

Figure 2:
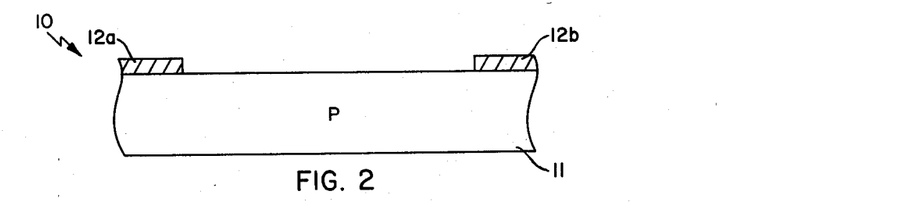
FIG. 2 is a cross-sectional view of the structure shown in FIG. 1 after removal of a portion of the silicon dioxide layer.

Referring to FIG. 2, a layer of negative photoresist (not shown) is then formed across the upper surface of silicon dioxide layer 12 and suitably patterned using well-known photolithographic techniques. The undesired portions of layer 12 and all of the negative photoresist are then removed with an etching solution. In the preferred embodiment, the wafer 10 is exposed to the etching solution for 8-12 minutes. The etching solution comprises 15 milliliters of hydrofluoric acid (HF), 68 grams of ammonium fluoride ($NH_4F$) and 100 milliliters of water ($H_2O$). After the etching is completed and the undesired portion of layer 12 has been removed, regions 12a and 12b of silicon dioxide remain.

Figure 3:
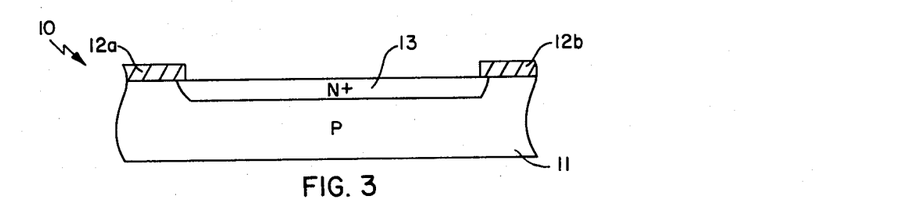
FIG. 3 is a further cross-sectional view showing a buried layer region formed in the surface of the semiconductor substrate.

Next, as shown in FIG. 3, to form what will become a buried layer, a buried layer predeposition step is performed in which the wafer 10 is placed in an antimony atmosphere for 55 to 65 minutes to form an N+ buried layer region 13 in the upper surface of substrate 11. Oxygen is then supplied to the wafer 10 for five minutes while the temperature of the structure is ramped to 1250° C. This creates a sheet resistivity for the N+ buried layer 13 of between 20 and 25 ohms per square. Silicon dioxide regions 12a and 12b are then removed using the same technique described above.

Figure 4:
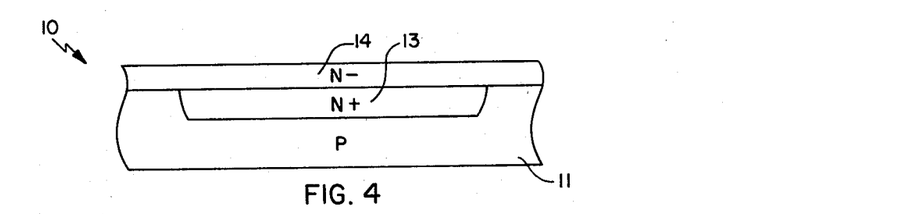
FIG. 4 is a further cross-sectional view after growing an epitaxial silicon layer.

As shown in FIG. 4, after removal of the silicon dioxide regions 12a and 12b, a layer 14 of epitaxial silicon is formed on the upper surface of substrate 11 and buried layer 13. Using dichlorosilane, the epitaxial layer 14 will be formed between 1.35 and 1.55 micrometers thick with a resistivity of approximately 10 ohm centimeters. Phosphorous is then implanted into the epitaxial layer 14 to convert it to N− conductivity. Using well-known ion implantation techniques and an implant energy of 100,000 electron volts, an ion concentration of phosphorous of $2.5 \times 10^{12}$ ions/cm$^2$ is created in the epitaxial layer. This results in a sheet resistivity of approximately 4500 to 6800 ohms per square.

Figure 5:
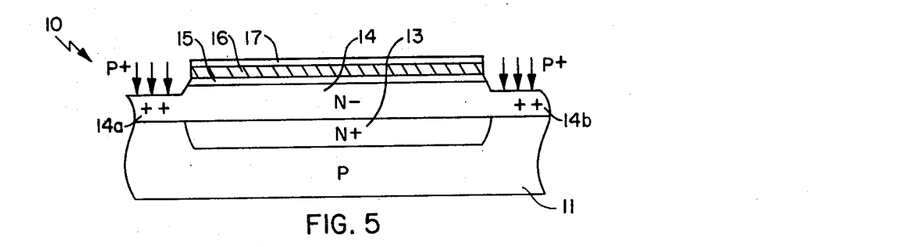
FIG. 5 is a further cross-sectional view after forming silicon nitride and silicon dioxide masking layers, etching the epitaxial silicon and doping the potential isolation oxide regions.

As shown in FIG. 5, a layer 15 of silicon dioxide approximately 400-550 Angstroms thick is then formed on the upper surface of the epitaxial layer 14 by oxidizing the layer 14 at 1000° C. Next, a layer 16 of silicon nitride ($Si_3N_4$) approximately 1425-1575 Angstroms thick is formed on the upper surface of oxide layer 15 by any well-known technique, for example, vapor deposition. Then, a thin layer 17 of silicon dioxide about 100 Angstroms thick is formed on the upper surface of nitride layer 16 by exposing the nitride layer 16 to 1000° C. steam oxidation for one hour.

The oxide layer 17, nitride layer 16, oxide layer 15 and epitaxial layer 14 are then patterned to provide for what will become regions of isolation oxide. First, a layer of negative photoresist (not shown) is formed across the upper surface of oxide layer 17. The photoresist is exposed and developed and serves as a mask for the oxide layer 17. The oxide layer 17 is then etched using the same techniques discussed above. Next, the silicon nitride layer 16 is etched using phosphoric acid ($H_2PO_5$) for about one hour. The wafer 10 is then dipped in hydrofluoric acid to remove the oxide layer 15. Then, approximately 5200-5600 Angstroms of the epitaxial layer 14 are removed using a silicon etch solution. One example of a suitable etch solution is a solution of one milliliter hydrofluoric acid, five milliliters $HNO_3$, and three milliliters of acetic acid. Next, as shown in FIG. 5, ion implantation is used to implant P+ conductivity type material, usually boron, into regions 14a and 14b of epitaxial layer 14. These regions may be formed using an implant energy of 20,000 electron volts to create a boron concentration of $1.2 \times 10^{14}$ ion/cm$^2$.

Figure 6:
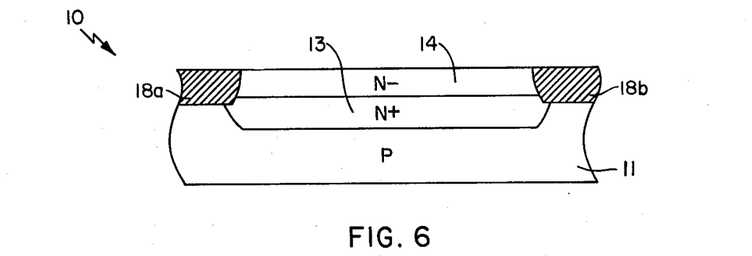
FIG. 6 is a further cross-sectional view after forming isolation oxide regions.

As shown in FIG. 6, the next step in the process is the formation of regions 18a and 18b of isolation oxide. In the preferred embodiment, this is accomplished by oxidizing the wafer 10 at 1000° C. for 170 minutes with pure nitrogen and then for 10 hours with steam. The result will be silicon dioxide regions which are 1.3 to 1.7 micrometers thick and have a sheet resistivity of approximately 4000-6400 ohms per square. The regions 18a and 18b of isolation oxide typically will be closed loops of material which extend through the epitaxial layer 14 to the lateral junction between the buried layer 13 and the substrate 11 to form an electrically isolated pocket of N− epitaxial silicon.

In the above-described manner, a matrix of electrically isolated epitaxial pockets may be formed on the wafer 10. The oxide isolation process steps discussed above with respect to FIGS. 1–6 are more fully described in U.S. Pat. No. 4,168,999 titled "Method for Forming Oxide Isolated Integrated Injection Logic Semiconductor Structures Having Minimal Encroachment Utilizing Special Masking Techniques", issued to Vora et al.

Additional information concerning oxide isolation techniques may be found in U.S. Pat. No. 3,648,125 titled "Method of Fabricating Integrated Circuits with Oxidized Isolation and the Resulting Structure" issued to Peltzer.

Oxide layer 17, nitride layer 16 and oxide layer 15 are then removed by well-known techniques.

Figure 7:
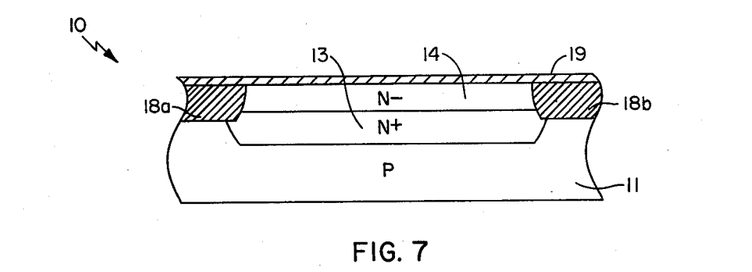
FIG. 7 is a further cross-sectional view after forming a thin oxide layer.

According to the present invention and as shown in FIG. 7, a thin silicon dioxide layer 19 about 200 Angstroms or less thick is then formed on the upper surface of the N− epitaxial pocket 14 and on oxide isolation regions 18a and 18b. A layer of negative photoresist (not shown) is formed across the surface of the thin oxide layer 19. The photoresist is patterned using conventional photolithographic techniques to expose portions of layer 19. The exposed portions of layer 19 are then removed using conventional etching techniques to form a thin region 19a of oxide over the epitaxial pocket 14. The thin oxide region 19a is formed such that first and second surface areas 14c and 14d of the epitaxial pocket 14 are defined as shown in FIG. 8.

Figure 8:
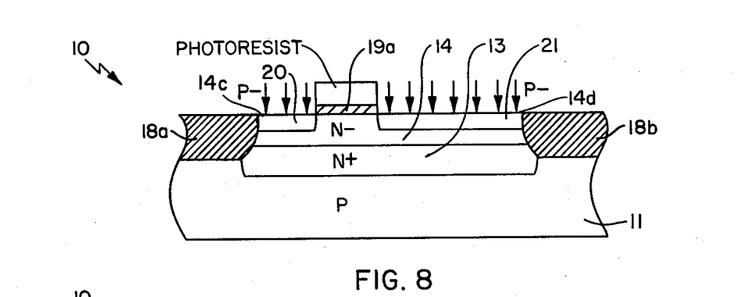
FIG. 8 is a further cross-sectional view after implanting first and second P− epitaxial regions.

Next, as further shown in FIG. 8, the first and second surface areas 14c and 14d are subjected to ion implantation such that first and second epitaxial regions 20 and 21 of P− conductivity type are formed in the epitaxial pocket 14. First and second P− regions 20 and 21 are formed by ion implantation with boron at 190,000 electron volts to create an ion density of $8 \times 10^{12}$ ions/cm$^2$. The photoresist layer overlying the thin oxide layer 19 is then removed by conventional techniques.

Figure 9:
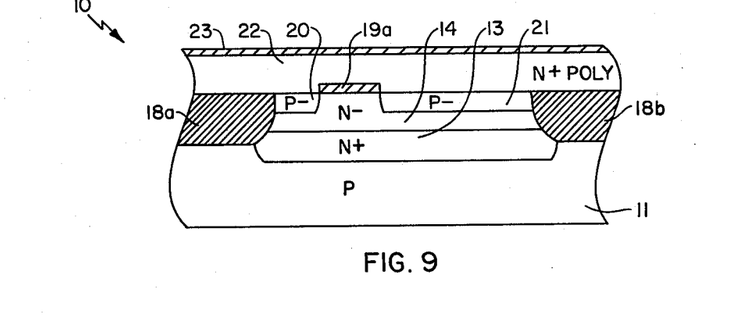
FIG. 9 is a further cross-sectional view after formation of an N+ polysilicon layer and an overlying silicon dioxide layer.

Next, as shown in FIG. 9, an N+ polysilicon layer 22 is formed on the exposed upper surface of the wafer 10 by, for example, chemical vapor deposition. A layer 23 of silicon dioxide is then formed on the upper surface of the N+ polysilicon layer 22 by well-known techniques. A layer of negative photoresist (not shown) is then formed on the upper surface of silicon dioxide layer 23. The photoresist is used to selectively mask and pattern the silicon dioxide layer 23.

Figure 10:
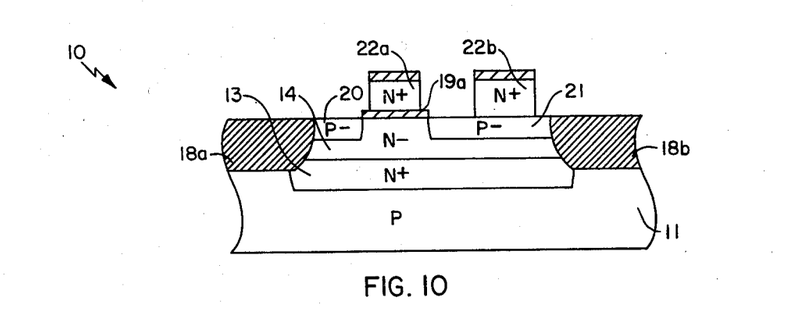
FIG. 10 is a further cross-sectional view after forming first and second regions of N+ polysilicon.

Then, as shown in FIG. 10, the N+ polysilicon layer 22 is etched to form a first region 22a of N+ polysilicon on the thin oxide layer 19a and a second region 22b of N+ polysilicon on the second P− region 21. For reasons which will be discussed below, the first region 22a of N+ polysilicon is formed on the thin oxide layer 19a such that edge portions of the thin oxide layer 19a are exposed as shown in FIG. 10.

Figure 11:
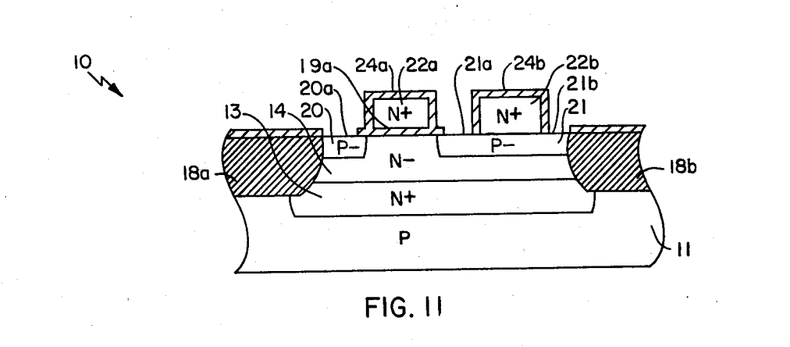
FIG. 11 is a further cross-sectional view after forming a silicon dioxide layer over the exposed surfaces of N+ polysilicon.
Figure 12:
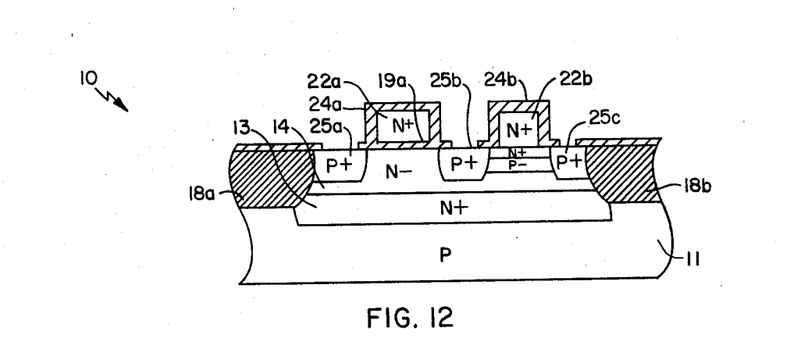
FIG. 12 is a further cross-sectional view after formation of P+ regions in the epitaxial layer.

The upper surface of a wafer 10, including the exposed side surfaces of the first and second N+ polysilicon regions 22a and 22b, is then covered by a layer of silicon dioxide which is about 1000 Angstroms thick. In the illustrated embodiment, this silicon dioxide layer is formed by heating wafer 10 in a manner such that N+ dopant from region 22b is driven into the underlying P− region 21 as shown in FIG. 12. Next, as shown in FIG. 11, the silicon dioxide layer is selectively patterned by plasma etch techniques to expose an upper surface 20a of the first P− region 20 and first and second selected portions 21a and 21b of the surface of the second P− region 21. Plasma etching of the silicon dioxide layer results in the definition of a second silicon dioxide region 24a which covers exposed surfaces of the first N+ polysilicon region 22a and of a third silicon dioxide region 24b which covers exposed surfaces of the second N+ polysilicon region 22b as shown in FIG. 11.

Next, as shown in FIG. 12, the first upper surface area 20a and the first and second selected portions 21a and 21b are then subjected to ion implantation such that first, second and third P+ epitaxial regions 25a, 25b and 25c are formed in the epitaxial pocket.

Figure 13:
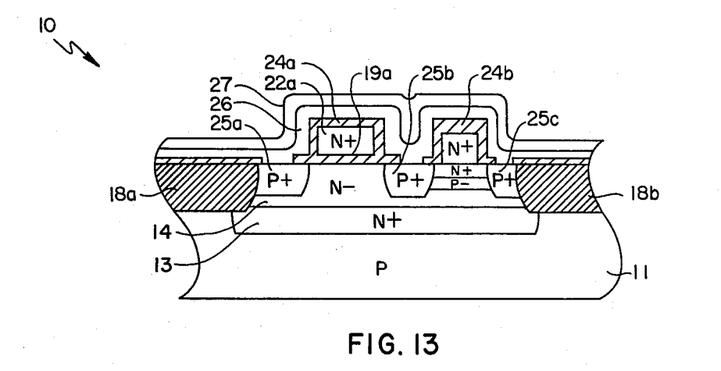
FIG. 13 is a further cross-sectional view after forming a P+ polysilicon layer and an overlying layer of silicon dioxide.

Next, as shown in FIG. 13, a layer 26 of P+ polysilicon is formed over the upper surface of wafer 10 such that the layer 26 contacts both the second and third P+ polysilicon regions 25b and 25c. A layer 27 of silicon dioxide is then formed over the surface of the P+ polysilicon layer 26. Polysilicon layer 26 and oxide layer 27 are then selectively patterned by forming a layer of negative photoresist (not shown) on the upper surface of layer 27. As previously described, the photoresist is used to mask and pattern the oxide layer 27.

Figure 14:
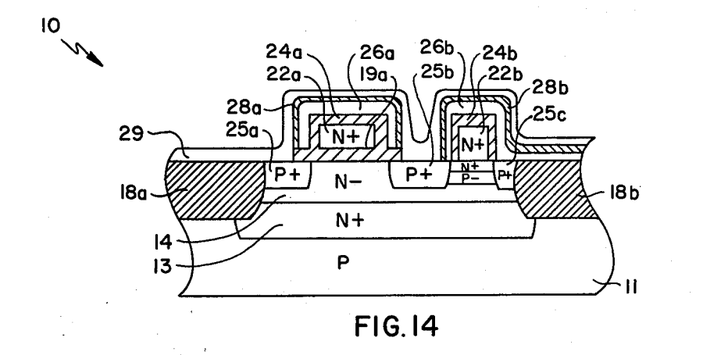
FIG. 14 is a cross-sectional view of the device which results from the process of the present invention.

As shown in FIG. 14, polysilicon layer 26 is then etched to form a first region 26a of P+ polysilicon on the silicon dioxide layer 24a which overlies the first region 22a of N+ polysilicon and a second region 26b of P+ polysilicon on the silicon dioxide layer 24b which overlies the second region 22b of N+ polysilicon. The first region 26a of P+ polysilicon is formed on the edge portions of the thin oxide layer 19a such that it is electrically isolated from the underlying epitaxial pocket. The second P+ polysilicon region 26b is defined such that it remains in contact with the second and third P+ epitaxial regions 25b and 25c.

A layer of silicon dioxide is then formed over the surface of the wafer 10, masked using photoresist as described above and etched to define fourth and fifth silicon dioxide regions 28a and 28b which electrically isolate P+ polysilicon regions 26a and 26b, respectively.

A layer 29 of metal is then deposited over the surface of the wafer 10 and patterned using conventional techniques to produce the nonvolatile memory cell shown in FIG. 14.

Figure 15:
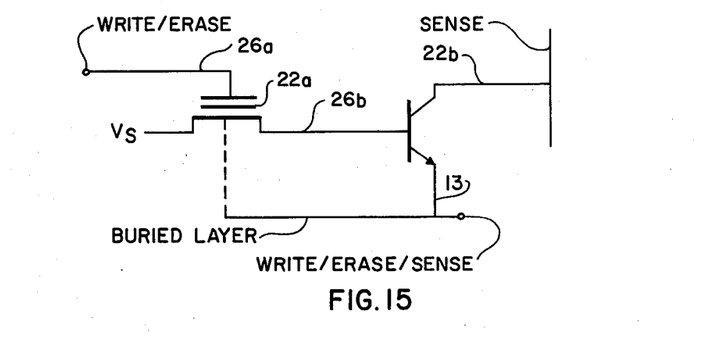
FIG. 15 is a circuit schematic for the structure shown in FIG. 14.

The process of the present invention results in a high speed nonvolatile memory cell, the circuit schematic for which is shown in FIG. 15. The cell comprises a floating gate pMOS transistor for data storage and a merged npn bipolar transistor for selective access to stored data. The first N+ polysilicon region 22a forms the floating gate of the pMOS storage transistor while the first P+ polysilicon region 26a forms its control gate. The second region of N+ polysilicon 22b forms the emitter of the npn bipolar transistor. The second region of P+ polysilicon 26b forms the contact to the second and third P+ epitaxial regions 25b and 25c which form part of the base of the npn bipolar transistor. The N+ buried layer 13 serves as the collector of the bipolar transistor.

Figure 16:
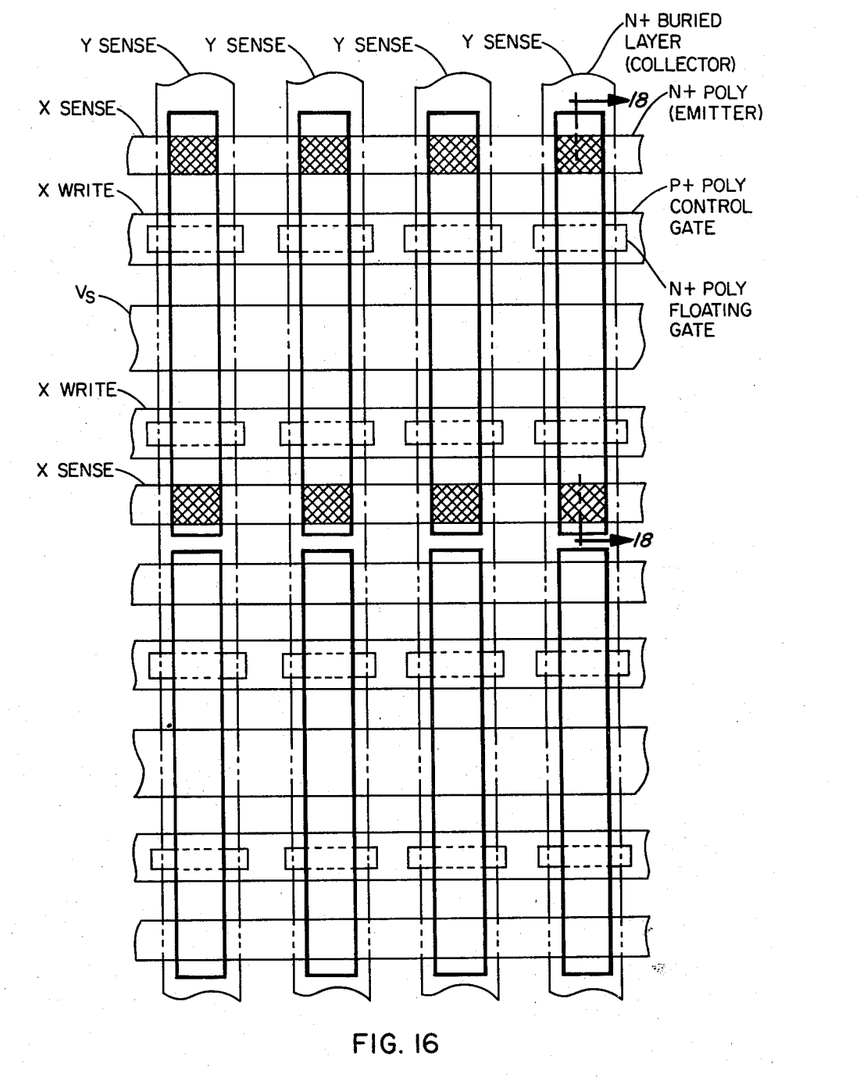
FIG. 16 is a topographical layout of a 4×4 memory array fabricated according to the process of the present invention.
Figure 17:
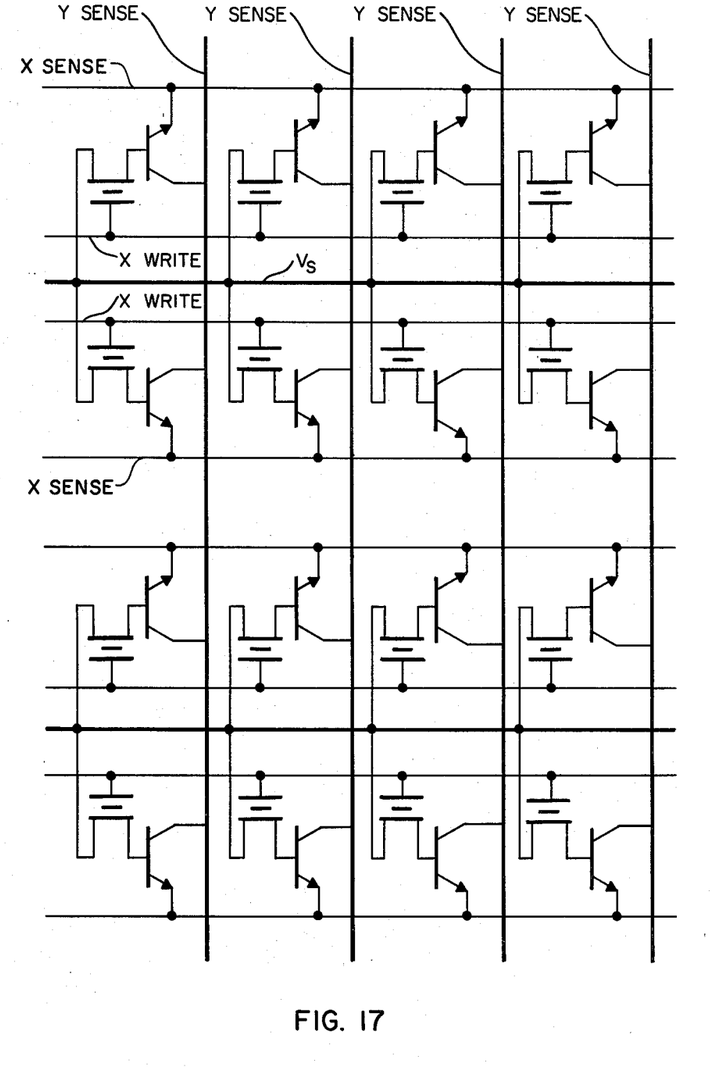
FIG. 17 is a circuit schematic of the memory array shown in FIG. 16.
Figure 18:
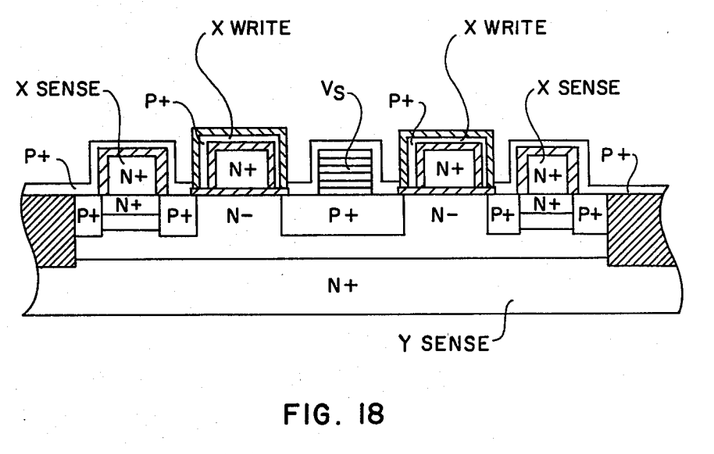
FIG. 18 is a cross-sectional view taken along line 18—18 in FIG. 16.

The memory cell structure shown in FIGS. 14 and 15 may be utilized in an electrically erasable, high speed, nonvolatile memory array such as that shown in FIGS. 16-18.

As shown in FIGS. 16-17, the memory array comprises a matrix of memory cells of the type described above which are formed as a plurality of rows and a plurality of columns of such cells. FIG. 16 shows a section of the memory array topography, representing 16 bits in a 4×4 array.

The memory array includes a plurality of X write lines, the control gate of each pMOS storage transistor in a row of memory cells being connected to an X write line corresponding to that row. In the illustrated embodiment, the X write line comprises P+ polysilicon and forms the control gate of the pMOS transistors in that row.

The array further includes a plurality of X sense lines, the emitter of each bipolar transistor in a row of cells being connected to an X sense line corresponding to that row. In the illustrated embodiment, the X sense line comprises N+ polysilicon and links all emitters of the npn bipolar transistors in the row.

The array further comprises a plurality of source lines, the source of each pMOS storage transistor in a row of cells being connected to a source line corresponding to that row.

The array further includes a plurality of Y sense lines, the collector of each npn bipolar transistor in a column of memory cells being connected to a Y sense line corresponding to that column. In the illustrated embodiment, orthogonal strips of N+ buried layer form the Y sense lines and are OR-tied to the collectors of the npn bipolar transistors.

To encode binary data into the memory, an erase voltage, preferably about +20 volts, is applied to each of the Y sense lines. Simultaneously, each of the X sense lines is maintained at the erase voltage, each of the X write lines is maintained at ground and the erase voltage is applied to each of the source lines. At these conditions, each of the storage transistors in the array assumes a relatively negative threshold state. A memory cell having a relatively negative threshold state is relatively less conducting when a read voltage is applied. Next, a write voltage, preferably about +20 volts, is applied to selected X write lines while maintaining unselected X write lines at ground. Simultaneously, selected Y sense lines are maintained at ground and an inhibit voltage, preferably about +5 volts, is applied to unselected Y sense lines. The inhibit voltage inhibits threshold shift by reducing the field across the thin oxide beneath the floating gate of the pMOS storage transistor. The inhibit voltage is insufficient to cause any significant threshold disturbance in unselected devices over many cycles of data change. At the same time, each of the X sense lines is maintained at an intermediate voltage, which intermediate voltage is between the write voltage and the inhibit voltage and preferably is about +10 volts. The intermediate voltage is equal to or less than the base/emitter breakdown voltage of the npn bipolar transistors in the array. At these conditions, the pMOS storage transistors of memory cells located at the intersections of selected X write lines and selected Y sense lines assume a relatively positive threshold state while the remaining memory cells remain at the relatively negative threshold state. A memory cell in a relatively positive threshold state is relatively more conducting when a read voltage is applied.

To read data from the memory, a selected X sense line is maintained at ground. Simultaneously, unselected X sense lines and each of the Y sense lines are maintained at about +3 to +5 volts. At these conditions, memory cells connected to the selected X sense line and having pMOS storage transistors in the relatively negative threshold state are less conducting than memory cells connected to the selected X sense line and having pMOS storage transistors in the relatively positive threshold state. Memory cells connected to the selected X sense lines are monitored to determine their relative conductance.

Table I provides a summary of operating conditions for the array.

TABLE I

| | Mode | TYPICAL OPERATING CONDITIONS | | | | | | | | ERASE |
|---|---|---|---|---|---|---|---|---|---|---|
| | | READ | | | | WRITE | | | | |
| | Axes Selected | X<br>Y | Yes<br>Yes | Yes<br>No | No<br>Yes | No<br>No | Yes<br>Yes | Yes<br>No | No<br>Yes | No<br>No | All<br>All |
| Control Line | Unit | | | | | | | | | |
| Xsense | V | 0 | 0 | 3 | 3 | 5 | 5 | 5 | 5 | 20 |
| Ysense | V | 3 | Don't care | 3 | 3 | 0 or 10 | $V_{W1}=10$ | $V_{W1}=10$ | $V_{W1}=10$ | 20 |
| Xwrite | V | 3 | 3 | 3 | 3 | $V_W=20$ | $V_W=20$ | 0 | 0 | 0 |
| $V_S$ | V | 3 | 3 | 3 | 3 | | | | | 20 |
| Ysense read 1 | μA | 100 | | | | | | | | |
| | | | | | | | N/A | | | N/A |
| Ysense read 0 | μA | 0 | | | | | | | | |

We claim:
1. A process for fabricating an oxide isolated electrically erasable memory cell semiconductor structure in an epitaxial layer of first conductivity type overlying a buried layer of first conductivity type, the process comprising the sequential steps of:
   (a) forming a first layer of insulating material of a thickness which permits tunneling of electrons therethrough over a first region of a substantially planar surface of the epitaxial layer;
   (b) introducing dopant of second conductivity type into all of the planar surface except the first region thereof;
   (c) forming a first region of polysilicon of first conductivity type on the first insulating layer and a second region of polysilicon of first conductivity type on a second region of the planar surface;
   (d) forming insulating material over all exposed surfaces of both the first and the second regions of polysilicon as well as over exposed areas of the planar surface;
   (e) patterning the insulating material to expose selected portions of the planar surface;

(f) introducing dopant of second conductivity type into the exposed selected portions of the planar surface;

(g) forming a first region of polysilicon of second conductivity type on the insulating material overlying the first region of polysilicon of first conductivity type and a second region of polysilicon of second conductivity type overlying the insulating material overlying the first region of polysilicon of first conductivity type;

(h) forming insulating material over all exposed surfaces of both the first and the second regions of polysilicon of second conductivity type; and (i) forming a layer of conductive material over the structure formed according to steps a-h above such that the conductive material contacts the exposed selected portions of the planar surface.

2. A process as recited in claim 1 wherein the first layer of insulating material is less than about 200 Angstroms thick.

3. A process according to claim 1 wherein said first conductivity type is N type.

4. A process according to claim 1 wherein said second conductivity type is P type.

5. A process according to claim 1 wherein said insulating material is silicon dioxide.

6. A process according to claim 1 wherein said doping is by ion implantation.

* * * * *